United States Patent
Kawaguchi

Patent Number: 5,953,628
Date of Patent: Sep. 14, 1999

[54] METHOD FOR FORMING WIRING FOR A SEMICONDUCTOR DEVICE

[75] Inventor: Akemi Kawaguchi, Neyagawa, Japan

[73] Assignee: Matsushita Electric Industrial Co., Ltd., Osaka, Japan

[21] Appl. No.: 09/014,129

[22] Filed: Jan. 27, 1998

[30] Foreign Application Priority Data

Jan. 28, 1997 [JP] Japan ............................. 9-013626

[51] Int. Cl.$^6$ ............. H01L 23/532; H01L 21/283; H01L 21/302; H01L 21/3205
[52] U.S. Cl. ............. 438/635; 438/645; 438/687; 257/762; 257/767
[58] Field of Search ................. 156/656; 427/123; 437/47; 136/256; H01L 25/532

[56] References Cited

U.S. PATENT DOCUMENTS

| | | | |
|---|---|---|---|
| 4,330,347 | 5/1982 | Hirayama et al. | 148/31.5 |
| 4,612,410 | 9/1986 | Hewig et al. | 136/256 |
| 4,755,394 | 7/1988 | Aoki et al. | 427/123 |
| 4,755,480 | 7/1988 | Yau et al. | 437/47 |
| 5,281,304 | 1/1994 | Kadomura | 156/656 |
| 5,654,245 | 8/1997 | Allen | 438/629 |
| 5,674,787 | 10/1997 | Zhao et al. | 437/230 |

FOREIGN PATENT DOCUMENTS

| | | | |
|---|---|---|---|
| 0794573A2 | 3/1997 | European Pat. Off. | 23/532 |
| 363270374 | 11/1988 | Japan | 41/88 |
| 152807 | 6/1991 | Japan . | |
| 196619 | 8/1991 | Japan . | |
| 196620 | 8/1991 | Japan . | |

OTHER PUBLICATIONS

Y. Hayashi et al., "Multilevel Interconnects . . . Metallization", 1996 Symposium on VLSI Technology, pp. 88–89.

"Self–Aligned Passivation Technology for Copper Interconnection Using Copper–Aluminum Alloy" Extended Abstract of the 1996 International Conference on Solid State Devices and Materials, Yokohama, 1996, pp. 112–114.

"Self-aligned passivation on copper interconnection durability against oxidizing ambient annealing", Appl. Phys. Lett. 63(7), Aug. 16, 1993.

Primary Examiner—Olik Chaudhuri
Assistant Examiner—Bernard E. Souw
Attorney, Agent, or Firm—Pearne, Gordon, McCoy & Granger LLP

[57] ABSTRACT

On a semiconductor substrate, an $SiO_2$ layer as an insulating layer and an intermediate insulating layer are stacked successively. The intermediate insulating layer selectively has an opening portion and a copper wiring is formed within the opening portion. The copper wiring is covered with an anti-oxidation layer. The anti-oxidation layer is formed of copper sulfide so that it becomes unnecessary to form another anti-oxidation layer which does not contain copper, the treatment in the vacuum can be simplified or thermal treatment step at high temperatures can be omitted.

7 Claims, 6 Drawing Sheets

METHOD FOR FORMING WIRING FOR A SEMICONDUCTOR DEVICE

BACKGROUND OF THE INVENTION

The present invention relates to a semiconductor device and a process for the fabrication thereof, particularly a structure and a fabrication process of a semiconductor device capable of preventing the resistance of a wiring from increasing due to oxidation of the wiring which contains copper.

The development of LSI which enables to create an economical and high-performance system permitting the very high speed processing of large-capacity signals has been accelerated. Upon development, there is a demand for reducing a delay in the wirings formed in the LSI.

With a view to satisfying the above demand, copper (Cu) or copper alloy is being employed as a metal having a low resistance and high migration resistance. Since Cu is a metal of low resistance compared with conventionally used Al, it seems to be a material which can attain the reduction of an interconnection delay. It however requires an anti-oxidation film to prevent oxidation of the surface of a copper (Cu) wiring because the copper is oxidized faster than aluminum (Al). Examples of the material for an anti-oxidation layer include transition metals such as Nb, Ta, Cr, Mo and W; metals such as Mg and Al; and nitride films such as TiWN and SiN/NSG. It has been proposed various methods of depositing such a material as an anti-oxidation layer at the periphery of the copper wiring, for example, Unexamined Japanese Patent Publication 3-152807; Appl. Phys. Lett., 63, 934(1993); Unexamined Japanese Patent Publication 3-196619 or 3-196620.

A description will next be made of conventional processes for the formation of an anti-oxidation layer with reference to accompanying drawings.

First, it is described a process for forming a copper wiring using an anti-oxidation layer as show in Unexamined Japanese Patent Publication 3-152807. FIGS. 4(a) to 4(d) are cross-sectional views in this forming process of the copper wiring.

In FIG. 4(a), an $SiO_2$ layer as an insulating layer 2 and an intermediate insulating layer 3 are stacked successively on a semiconductor substrate 1, followed by patterning the intermediate insulating layer 3 by the photolithography, whereby an opening portion is formed in a region in which a copper wiring is to be formed. The anti-oxidation layer 4 is then formed selectively on the opening portion. As illustrated in FIG. 4(b), a copper wiring 9 is deposited so as to cover the opening portion sufficiently. Examples of the deposition method include sputtering method and CVD method. As illustrated in FIG. 4(c), an unnecessary portion of copper is removed until the intermediate insulating layer 3 is exposed. Finally, an anti-oxidation layer is formed again on the exposed copper as illustrated in FIG. 4(d).

Next, it is described a process for forming a copper wiring using an anti-oxidation layer as show in Appl. Phys. Lett., 63, 934(1993). FIGS. 5(a) to 5(d) are cross-sectional views in this forming process of the copper wiring.

In FIG. 5(a), an $SiO_2$ layer as an insulating layer 2 and an intermediate insulating layer 3 are stacked successively on a semiconductor substrate 1, followed by patterning the intermediate insulating layer 3 by the photolithographic technique, whereby an opening portion is formed in a region in which a copper wiring is to be formed. The anti-oxidation layer 4 (mainly a transition metal such as Nb, Ta, Cr, Mo or W) is then formed selectively in the opening portion. As illustrated in FIG. 5(b), a copper wiring 9 is deposited so as to cover the opening portion sufficiently. Examples of the deposition method include sputtering method and CVD method. As illustrated in FIG. 5(c), an unnecessary portion of copper is removed until the intermediate insulating layer 3 is exposed. Finally, as illustrated in FIG. 5(d), self-passivation is formed by diffusing the metal for the underground anti-oxidation layer on the Cu surface by thermal treatment.

Further, it is described a process for forming a copper wiring using an anti-oxidation layer as show in Unexamined Japanese Patent Publication 3-196619 or 3-196620. FIGS. 6(a) to 6(c) are cross-sectional views in this forming process of the copper wiring.

In FIG. 6(a), an $SiO_2$ layer as an insulating layer 2 and an intermediate insulating layer 3 are stacked successively on a semiconductor substrate 1, followed by patterning the intermediate insulating layer 3 by the photolithographic technique, whereby an opening portion is formed in a region in which a copper wiring is to be formed. A copper wiring 9 is then deposited so as to cover the opening portion sufficiently. At this time, an element (Nb, Ta, Cr, Mo or W or a metal such as Mg or Al) which is to be an anti-oxidation layer together with copper is added to copper in advance. Examples of the deposition method include sputtering method and CVD method. As illustrated in FIG. 6(b), an unnecessary portion of copper is then removed until the intermediate insulating layer 3 is exposed. Finally, as illustrated in FIG. 6(c), self-passivation is formed by diffusing the metal for the underground anti-oxidation layer on the Cu surface by thermal treatment.

However, the above-described conventional processes for the formation of a copper wiring however are not free from the problems as described below.

Described specifically, in the above-described process for the formation of an anti-oxidation layer for Cu, the vacuum treatment is employed for the formation of the anti-oxidation layer and copper layer, but it is low in through-put. In addition, it is necessary to form both the anti-oxidation layer and copper as a wiring material by the treatment in the vacuum, which requires the use of respective film forming apparatuses.

Moreover, when an anti-oxidation layer is formed by diffusion caused by thermal treatment, the temperature is as high as about 700° C. At this time the grain size of copper, which is a material for a wiring, becomes large, resulting in a change in the resistance value of the wiring.

SUMMARY OF THE INVENTION

An object of the present invention is therefore to reduce the frequency of the treatment in the vacuum or to omit the thermal treatment at high temperatures in consideration of the above-described problems, thereby providing a semiconductor device which has a copper wiring having an anti-oxidation layer formed thereon and a fabrication process thereof.

With a view to attaining the above-described object, the semiconductor device according to the present invention has a copper wiring which is covered at its periphery with a copper sulfide layer.

The semiconductor device having the above-described constitution is fabricated by any one of the following processes.

A process according to the present invention comprises the steps of: forming an insulating layer selectively on a semiconductor substrate to form an opening portion in which a metal wiring containing at least copper is to be formed; forming a thin copper layer within the opening portion; sulfidizing the thin copper layer to form a first copper sulfide layer; embedding the metal containing at least copper on the thin copper sulfide layer in the opening portion; and sulfidizing a surface of the metal containing copper embedded in the opening portion to form a second copper sulfide layer.

A process according to the present invention comprises the steps of: depositing an anti-oxidation layer on a semiconductor substrate; depositing a metal layer containing at least copper over the anti-oxidation layer; patterning the metal layer by using a resist; and sulfidizing a surface of the patterned metal layer to form a copper sulfide layer.

According to the above-described constitution of the present invention, it becomes unnecessary to form another anti-oxidation layer which does not contain copper, whereby the treatment in the vacuum can be simplified or the thermal treatment step at high temperatures can be omitted.

DETAILED DESCRIPTION OF THE PREFERRED EMBODIMENTS

Figure 2:
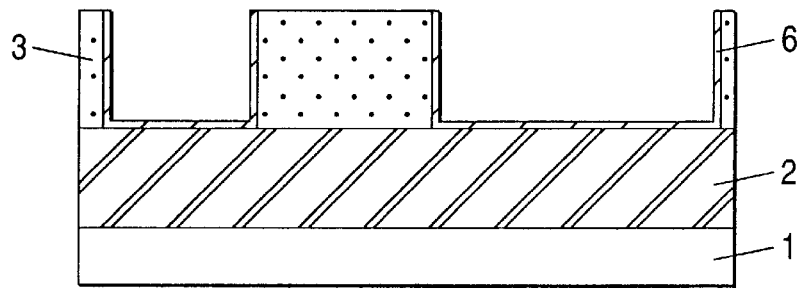
FIGS. 2(a) to 2(e) are cross-sectional views illustrating a process for the fabrication of a semiconductor device according to a first embodiment of the present invention, which has a copper wiring protected with a copper sulfide layer.
Figure 2:
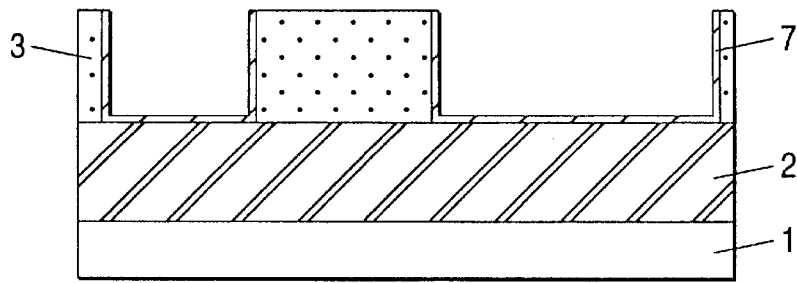
Figure 2:
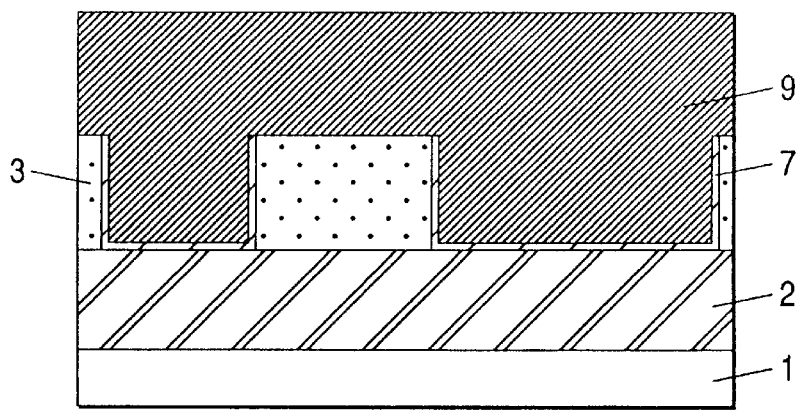
Figure 2:
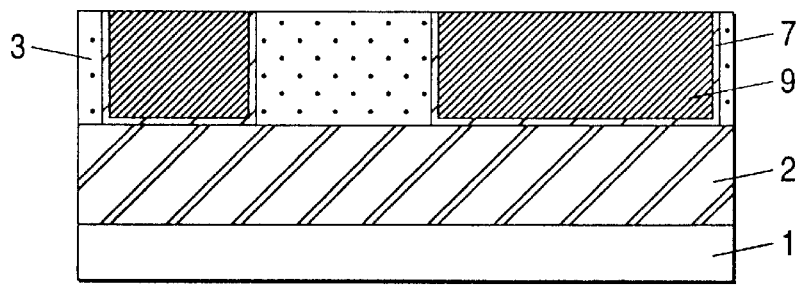
Figure 2:
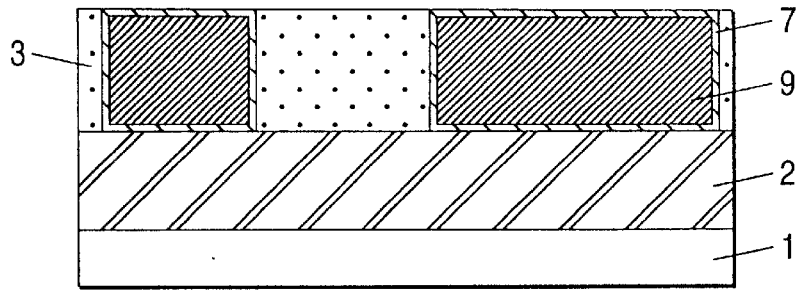
Figure 3:
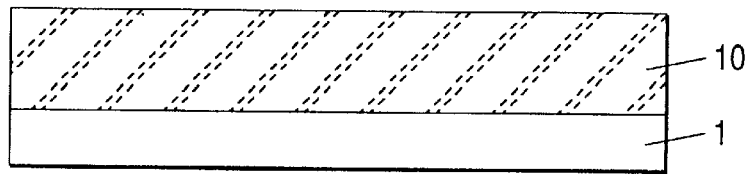
FIGS. 3(a) to 3(e) are cross-sectional views illustrating a process for the fabrication of a semiconductor device according to a second embodiment of the present invention, which has a copper wiring protected with a copper sulfide layer.
Figure 3:
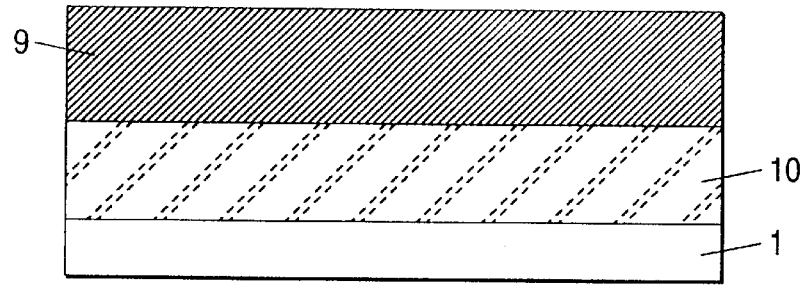
Figure 3:
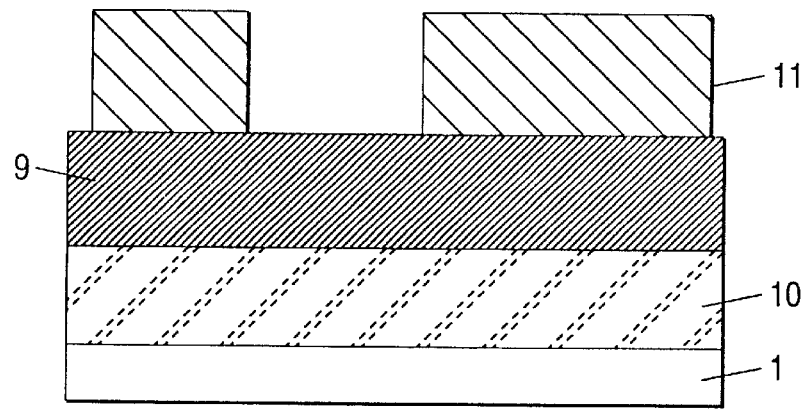
Figure 3:
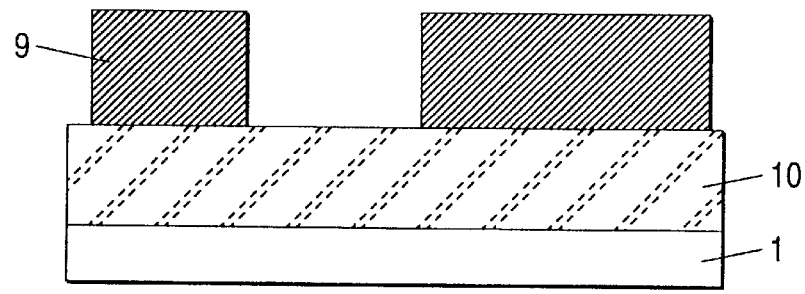
Figure 3:
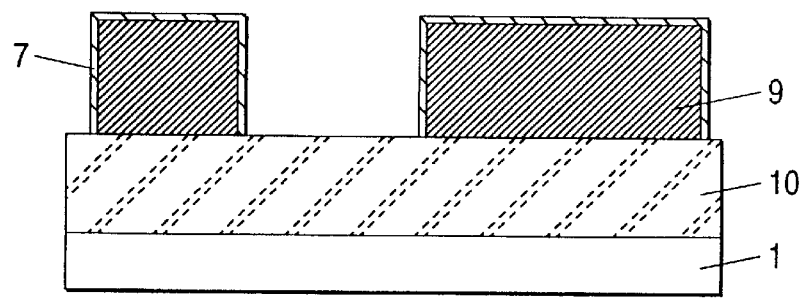
Figure 4A:
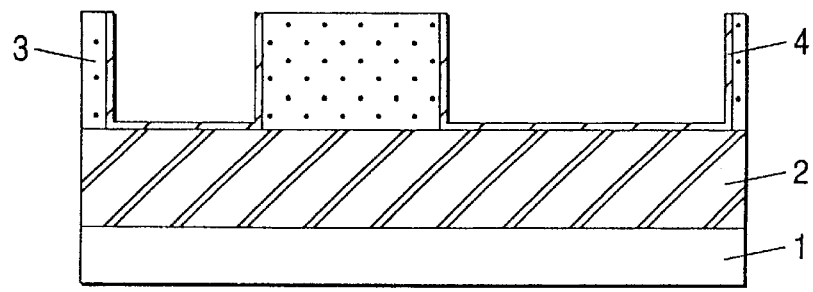
FIGS. 4(a) to 4(d) are cross-sectional views illustrating a process for the fabrication of a conventional semiconductor device having a copper wiring protected at the surface thereof with an anti-oxidation layer.
Figure 4B:
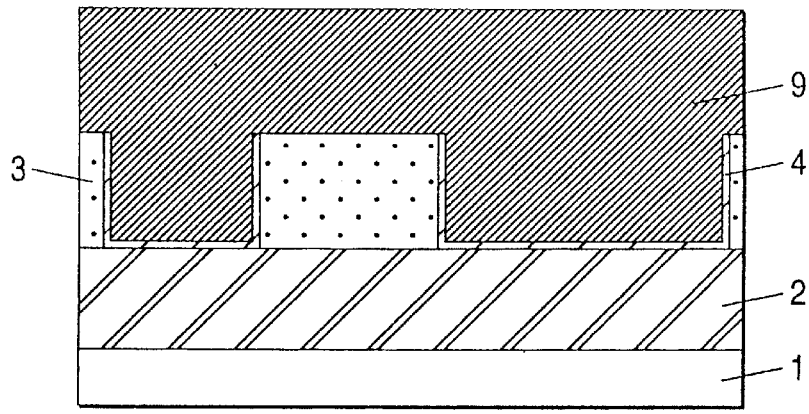
Figure 4C:
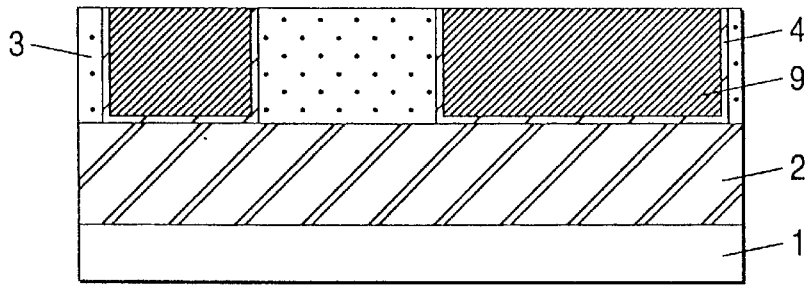
Figure 4D:
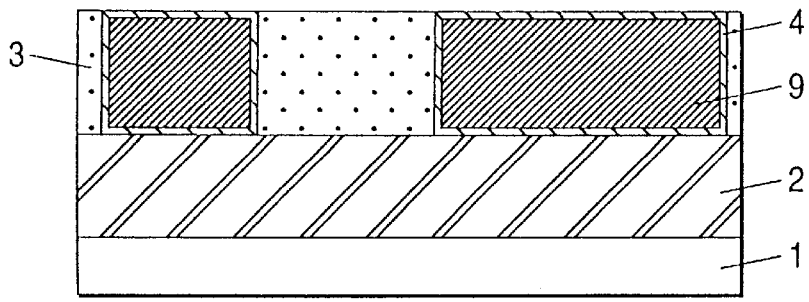
Figure 5A:
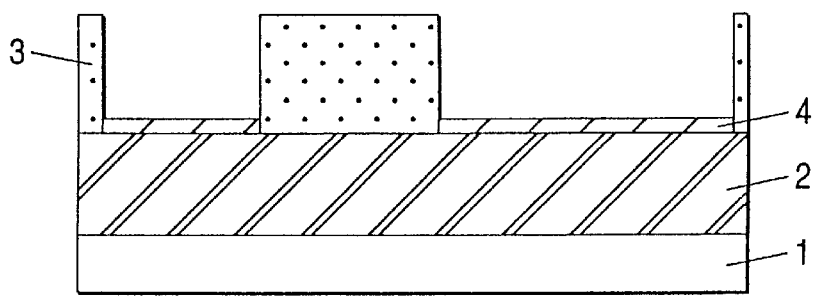
FIGS. 5(a) to 5(d) are cross-sectional views illustrating a process for the fabrication of another conventional semiconductor device having a copper wiring protected at the surface thereof with an anti-oxidation layer.
Figure 5B:
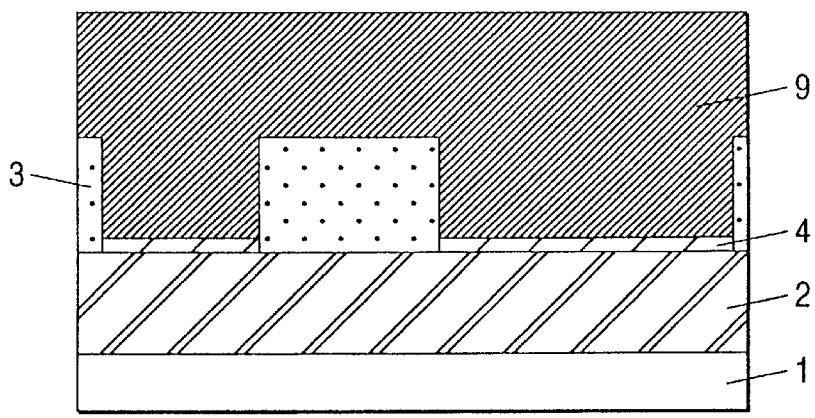
Figure 5C:
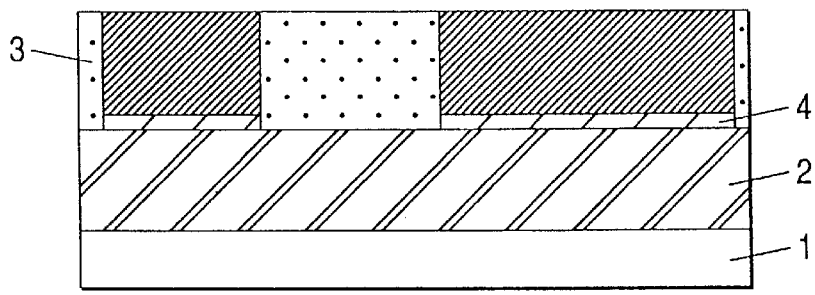
Figure 5D:
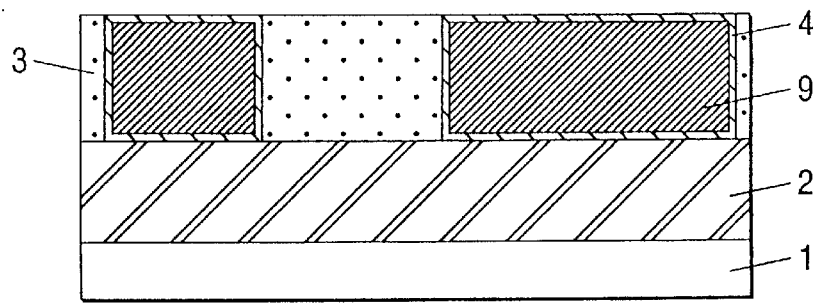
Figure 6A:
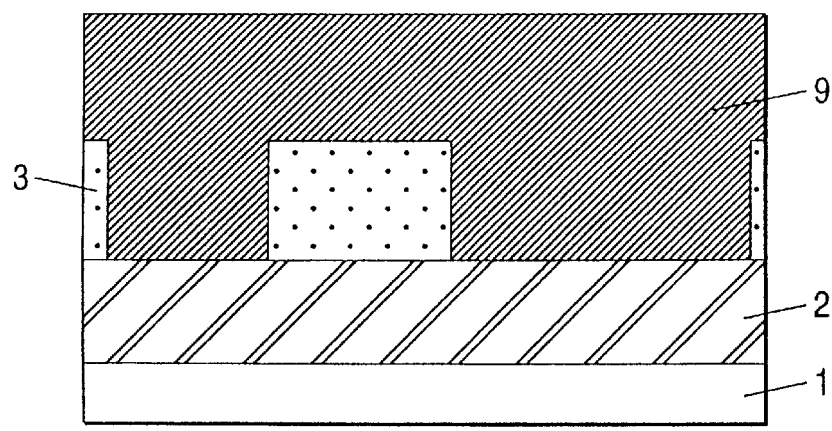
FIGS. 6(a) to 6(c) are cross-sectional views illustrating a process for the fabrication of a further conventional semiconductor device having a copper wiring protected at the surface thereof with an anti-oxidation layer.
Figure 6B:
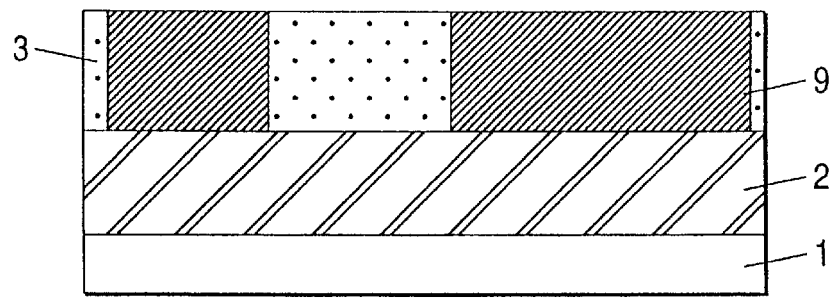
Figure 6C:
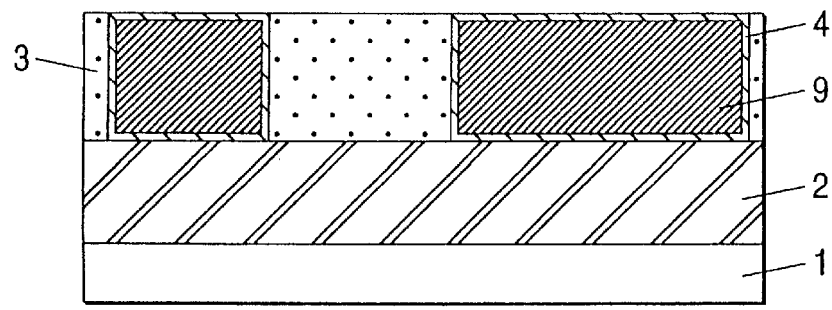

The semiconductor device having a copper wiring and a process for the fabrication thereof, each according to the embodiment of the present invention, will hereinafter be described with reference to FIGS. 1 to 3.

Figure 1:
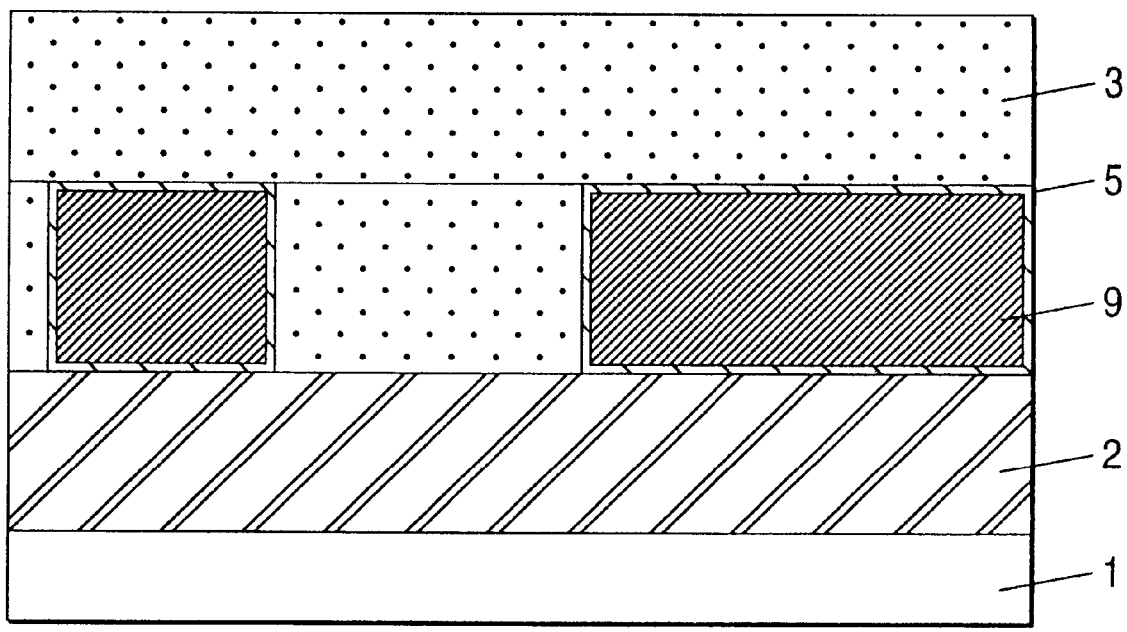
FIG. 1 is a cross-sectional view illustrating a semiconductor device according to the embodiment of the present invention, which has a copper wiring protected with a copper sulfide layer.

FIG. 1 is a cross-sectional schematic view illustrating the semiconductor device of the present invention. As illustrated in FIG. 1, an $SiO_2$ layer serving as an insulating layer 2 and an intermediate insulating layer 3 are formed successively on a semiconductor substrate 1. The intermediate insulating layer 3 selectively has an opening portion, in which a copper wiring 9 is formed. The copper wiring is covered with an anti-oxidation layer 5. Different from the conventional semiconductor device, the anti-oxidation layer 5 is not a transition metal but copper sulfide represented by $Cu_xS$ ($0<x\leq2$).

Copper sulfide is an insulating layer and is capable of certainly preventing the oxidation of copper which is a main component of an wiring material.

A description will next be made of a process for the fabrication of a semiconductor device having a structure as illustrated in FIG. 1, with reference to it.

Embodiment 1

FIGS. 2(a) to 2(e) are cross-sectional views illustrating a process for the fabrication of a semiconductor device of Embodiment 1 according to the present invention, which has a highly anti-oxidation copper wiring. The process will be hereinafter described in order.

As illustrated in FIG. 2(a), an $SiO_2$ oxide layer and an intermediate insulating layer 3 are formed successively on a semiconductor substrate 1, followed by patterning of the intermediate insulating layer 3 by making use of the photolithographic technique, whereby an opening portion is formed in a region in which a copper wiring is to be formed. The process up to the formation of the opening portion is substantially similar to that according to the prior art. In the opening portion, a thin copper layer 6 is then deposited either by the sputtering or CVD method to give a thickness of about 3 nm.

As illustrated in FIG. 2(b), the substrate (wafer) 1 having copper thin layer 6 deposited thereon is immersed in an ammonium sulfide solution, which has been obtained by diluting ammonium sulfide with water to give a concentration of 5%, for about 2 seconds to sulfidize the thin copper layer 6 into a copper sulfide layer 7. As illustrated in FIG. 2(c), copper layer 9 is then deposited (embedded) in the opening portion so as to cover the opening portion sufficiently. Upon covering, the same apparatus used for the formation of the thin copper layer 6 can be employed, which makes it possible to form the copper layer and anti-oxidation layer more easily than the formation of such layers using different apparatuses. As illustrated in FIG. 2(d), an unnecessary portion of the copper layer 9 is removed by the CMP (chemical mechanical polishing) method or the like until the intermediate insulating layer 3 is exposed. Thus-treated substrate is immersed again in a diluted ammonium sulfide solution for about 2 seconds to convert the exposed copper surface into a copper sulfide layer 7 by sulfidization treatment. In order to suppress an increase of the resistance of the wiring, it is desirable to make the thickness of the sufidized layer as thin as possible. According to the present invention, the thickness of the sulfidized layer is 5 nm or less.

According to the above-described embodiment of the present invention, the same apparatus can be employed both for the deposition of copper layer 9 and for the formation of the copper thin layer 6 which will serve as an anti-oxidation layer later, and the surface of the copper wiring can be covered with copper sulfide, that is, an anti-oxidation layer without thermal treatment.

Embodiment 2

FIGS. 3(a) to 3(e) are cross-sectional views illustrating a process for the fabrication of a semiconductor device of Embodiment 2 according to the present invention, which has a highly anti-oxidation copper wiring. The process will be hereinafter described in order.

As illustrated in FIG. 3(a), an insulating layer 10 (for example, SiN/NSG), which is to serve as an anti-oxidation layer, is formed on a semiconductor substrate 1. As illustrated in FIG. 3(b), a metal layer 9 for a copper wiring is then formed on the insulating layer 10 by the sputtering or CVD method, followed by patterning of a resist 11 as illustrated in FIG. 3(c). With the resist 11 as a mask, the copper wiring 9 is patterned as illustrated in FIG. 3(d).

The thus-treated substrate is then immersed for about 2 seconds in ammonium sulfide, which has been diluted with water to give a concentration of 5%, whereby the periphery of the copper wiring 9 is converted into copper sulfide 7 as illustrated in FIG. 3(e). It is also desired to control the thickness of copper sulfide to 5 nm or less as in the above-described Embodiment 1.

In order to enhance adhesion between the insulation layer and the copper layer 9, a TiN layer may be formed therebetween.

According to the above-described embodiment of the present invention, it becomes unnecessary to form an anti-oxidation layer through a vacuum process and the periphery of a copper wiring can be covered with copper sulfide, which serves as an anti-oxidation layer, without thermal treatment.

The present invention was described above according to some embodiments. The ammonium sulfide treatment, which is one of the most simple Wet treatment methods, was given as an example of the sulfidizing treatment for copper in the above embodiments. Similar effects can however be attained even by the treatment with a hydrogen sulfide gas, the treatment with plasma of hydrogen sulfide or the like.

According to the present invention, the periphery of a copper wiring is protected with a copper sulfide layer. This copper sulfide layer can be used as an anti-oxidation layer for the copper wiring. At this time, it becomes unnecessary to form the anti-oxidation layer in the step different from that for the formation of the copper wiring and besides, the anti-oxidation layer can be formed without the treatment in the vacuum.

In addition, the adoption of the Wet treatment makes it possible to form the anti-oxidation layer for the copper wiring without thermal treatment, by which a change in the wiring resistance which occurs with an increase in the grain size of copper can be suppressed.

What is claimed is:

1. A process for the fabrication of a semiconductor device, comprising the steps of:

forming an insulating layer selectively on a semiconductor substrate to form an opening portion in which a metal wiring containing at least copper is to be formed;

forming a thin copper layer within said opening portion;

sulfidizing said thin copper layer to form a first copper sulfide layer;

embedding metal containing at least copper on said first copper sulfide layer in said opening portion; and sulfidizing a surface of copper deposited in said opening portion to form a second copper sulfide layer.

2. A process for the fabrication of a semiconductor device, comprising the steps of:

depositing an anti-oxidation layer composed of an insulating film on a semiconductor substrate;

depositing a metal layer containing at least copper on an upper surface of said anti-oxidation layer;

patterning said metal layer by using a resist; and sulfidizing a surface of said patterned metal layer to form a copper sulfide layer, said sulfidized surface including a portion of said metal layer exposed during patterning of said metal layer.

3. A process for the fabrication of a semiconductor device as claimed in claim 2, wherein said anti-oxidation layer including a silicon nitride.

4. A process for fabrication of semiconductor device as claimed in claim 1, wherein said sulfidization process is performed by wet treatment with a copper sulfide generating solution.

5. A process for fabrication of semiconductor device as claimed in claim 4, wherein said copper sulfide generating solution contains ammonium sulfide.

6. A process for fabrication of semiconductor device as claimed in claim 2, wherein said sulfidization process is performed by wet treatment with a copper sulfide generating solution.

7. A process for fabrication of semiconductor device as claimed in claim 6, wherein said copper sulfide generating solution contains ammonium sulfide.

* * * * *

UNITED STATES PATENT AND TRADEMARK OFFICE
CERTIFICATE OF CORRECTION

PATENT NO. : 5,953,628
DATED : September 14, 1999
INVENTOR(S) : Kawaguchi

It is certified that error appears in the above-indentified patent and that said Letters Patent is hereby corrected as shown below:

On the Title Page, Section [57], ABSTRACT, Line 4, delete "formedwithin" and insert --formed within--.

Column 5, Line 12, delete "layer" and insert --layer 10--.

Signed and Sealed this

Second Day of May, 2000

Attest:

Q. TODD DICKINSON

Attesting Officer

Director of Patents and Trademarks